United States Patent
Konishi et al.

(10) Patent No.: US 6,385,805 B2
(45) Date of Patent: *May 14, 2002

(54) SCRUBBING APPARATUS

(75) Inventors: Nobuo Konishi, Yamanashi-ken; Kenji Sekiguchi; Keizo Hirose, both of Kofu, all of (JP)

(73) Assignee: Tokyo Electron Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,037

(22) Filed: Feb. 19, 1999

(30) Foreign Application Priority Data

Feb. 20, 1998 (JP) .......................................... 10-056001

(51) Int. Cl.[7] .............................. A46B 13/02; B08B 3/12
(52) U.S. Cl. .............................. 15/77; 15/88.2; 15/88.3; 134/902
(58) Field of Search .......................... 15/77, 88.2, 88.3, 15/102, 97.1; 134/153, 902; 118/52

(56) References Cited

U.S. PATENT DOCUMENTS

| | | | | |
|---|---|---|---|---|
| 5,368,054 A | * | 11/1994 | Koretsky et al. | 134/153 |
| 5,465,447 A | * | 11/1995 | Itoh et al. | 15/88.3 |
| 5,651,160 A | * | 7/1997 | Yonemizu et al. | 15/302 |
| 5,685,039 A | | 11/1997 | Hamada et al. | |
| 5,868,866 A | * | 2/1999 | Maekawa et al. | 134/153 |
| 5,870,793 A | * | 2/1999 | Choffat et al. | 15/102 |
| 5,892,315 A | * | 4/1999 | Gipson et al. | 310/317 |
| 5,958,145 A | * | 9/1999 | Yonemizu et al. | 134/2 |
| 5,976,267 A | * | 11/1999 | Culkins et al. | 134/6 |
| 5,980,647 A | * | 11/1999 | Buker et al. | 134/33 |
| 6,151,744 A | * | 11/2000 | Ohtani et al. | 15/88.2 |
| 6,260,562 B1 | * | 7/2001 | Morinishi et al. | 134/57 R |

* cited by examiner

Primary Examiner—Robert J. Warden, Sr.
Assistant Examiner—Kaj K. Olsen
(74) Attorney, Agent, or Firm—Oblon, Spivak, McClelland, Maier & Neustadt, P.C.

(57) ABSTRACT

A scrubbing apparatus is provided which sufficiently cleans every site on the wafer by a cleaning accelerating action of ultrasonic waves, the scrubbing apparatus comprising a substrate support section for supporting a substrate horizontally and substantially in contact with a circumferential portion of the substrate while front side and back side surfaces of the substrate are substantially kept untouched in operation by the substrate, rotation drive means for driving the substrate support section to rotate in order to give a rotation force to the substrate, a brush for scrub-cleaning the substrate while contacting at least the front surface, a main nozzle provided with a first supply circuit for supplying a-cleaning liquid in at least a central region of the substrate, an auxiliary nozzle provided with a second supply circuit for supplying the cleaning liquid in at least a peripheral region of the substrate, and an ultrasonic oscillator for applying ultrasonic waves to the cleaning liquid supplied on the substrate from an auxiliary nozzle.

5 Claims, 7 Drawing Sheets

SCRUBBING APPARATUS

BACKGROUND OF THE INVENTION

1. Field of the Invention

The present invention relates to a scrubbing apparatus for cleaning the surface of a substrate which has been subjected to film formation or polishing processing.

2. Description of the Prior Art

Significant defects occur in a patterned circuit of a semiconductor device when contamination such as particles, organic material and metallic ions are attached on the surface of a semiconductor wafer in a photolithographic process. Hence, it is very important to keep a wafer surface in a clean condition. For this reason, the wafer surface is cleaned in a photolithographic process any time when a necessity arises. For example, after a film formation process such as interlayer insulating film formation and a polishing process such as chemical mechanical polishing (hereinafter referred to as "CMP"), a wafer is rubbed by a brush while pouring a cleaning liquid on the wafer surface and contamination is thereby removed from the wafer surface. In such brush cleaning, a scrubbing apparatus with a spin chuck and a rotary brush is employed. The spin chuck is provided with a plurality of movable support members for supporting a wafer. When the spin chuck is rotated, an upper portion of the movable support members are inward inclined by a centrifugal force and put into contact with a circumferential portion of the wafer, so that the wafer is fast held so as not to get away from the spin chuck. In such a conventional brushing apparatus, however, since the brush collides against the movable support members, cleaning actions are required to progress so as to avoid such an interference. When cleaning is performed in such a brushing apparatus while avoiding the collision, a cleaning effect along the wafer circumferential portion comes to be short.

Recently, CMP has well been used as a processing technique for planarization of a pattern forming surface and when a pattern forming surface of a wafer is polished by CMP, much of foreign matter attaches along a peripheral portion of the wafer surface and on an edge surface of the wafer: such as particles resulted from a work itself, a polishing slurry and the like. For this reason, demand from users for cleaning the wafer peripheral portion to a sufficient extent has progressively been increased.

BRIEF SUMMARY OF THE INVENTION

It is accordingly an object of the present invention is to provide a scrubbing apparatus for sufficiently cleaning a peripheral portion of a substrate.

A scrubbing apparatus according to the present invention comprises: a substrate support section for supporting a substrate horizontally and substantially in contact with a circumferential portion of the substrate while front side and back side surfaces of the substrate are substantially kept untouched in operation by the substrate; rotation drive means for driving the substrate support section to rotate in order to give a rotation force to the substrate; a brush member for scrub-cleaning the substrate while contacting at least the front side surface; a main nozzle provided with a first supply circuit for supplying a cleaning liquid in at least a central region of the substrate; an auxiliary nozzle provided with a second supply circuit for supplying the cleaning liquid in at least a peripheral region of the substrate; and an ultrasonic oscillator for applying ultrasonic waves to the cleaning liquid supplied on the substrate from an auxiliary nozzle.

A scrubbing apparatus according to the present invention comprises: control means for controlling the ultrasonic oscillator, wherein the control means, controls the ultrasonic oscillator so that the cleaning liquid supplied on the substrate from the main nozzle is also applied with ultrasonic waves and that a power of ultrasonic waves applied in the peripheral portion of the substrate is stronger than in the central region of the substrate and the cleaning liquid applied with ultrasonic waves is supplied not only in the peripheral region of the substrate from the auxiliary nozzle, but in the central region of the substrate from the main nozzle.

Since the cleaning liquid which is applied with ultrasonic waves penetrates into even a small gap with ease, every points on a substrate can be cleaned thoroughly. Therefore, the cleaning liquid can reach even a site which a brush member cannot contact, such as a clearance between a substrate support section and a substrate, and sufficient cleaning can be realized, perfectly covering the entire surface of the substrate by a cleaning acceleration action of ultrasonic waves.

Besides, since the substrate support section and the substrate are rotated in a relative manner, a contact site between both is constantly changed and therefore such a movement eliminates a site on the substrate where no cleaning occurs.

DETAILED DESCRIPTION OF THE INVENTION

Below, various preferred embodiments of the present invention will be detailed with reference to the accompanying drawings.

Figure 1:
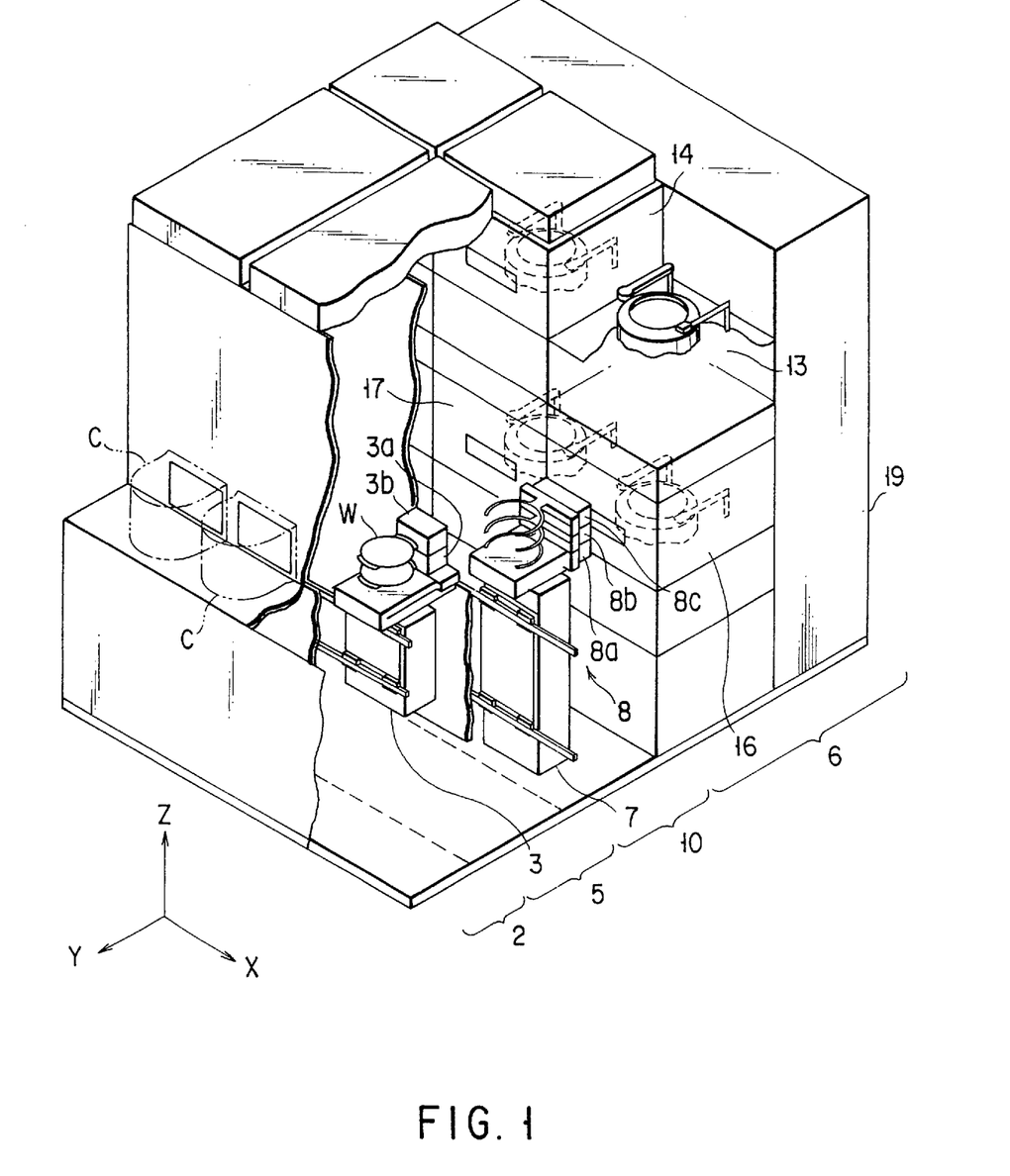
FIG. 1 is a partial cutaway, perspective view schematically showing a scrubbing system for cleaning a semiconductor wafer.

A cleaning system 1 comprises a load/unload section 2 in which semiconductor wafers W are transported in and out together with a cassette C while a lot of 25 wafers as unit are accommodated in the cassette C. In the load/unload section 2, a table is provided and, for example, three cassettes are placed on the table. A first transport section 5 is formed along the table and a first transport arm mechanism 3 is provided in the first transport section 5. The first transport arm mechanism 3 comprises: a plurality of holders 3a, 3b; a forward/backward drive mechanism for moving the holders 3a, 3b forward or backward; an X axis movement mechanism for moving the holders 3a, 3b in an X axis direction; a Z axis movement mechanism for moving the holders 3a, 3b in a Z axis direction; and a θ rotation mechanism for rotating holders 3a, 3b about Z axis.

A transport-in/buffer mechanism (not shown) is provided on one side of the first transport section 5 and a transport-out/buffer mechanism (not shown) is provided on the other side of the first transport section 5. The first transport arm mechanism 3 takes out wafers W before cleaning from a cassette C one by one with a holder 3a in a lower place and places the wafers W on a transport-in/buffer mechanism, while the first transport mechanism 3 takes out wafers W after cleaning from a transport-out/buffer mechanism with a holder 3b in an upper place and transports the wafers W into a cassette C one by one.

A second transport section 10 is formed along the first transport section 5 in a adjacent manner and a second transport arm mechanism 8 is provided in the second transport section 10 in a movable manner. The second transport arm mechanism 8 comprises: a plurality of holders 8a, 8b, 8c; a forward/backward drive mechanism for moving the holders 8a, 8b, 8c forward or backward; an X axis movement mechanism for moving the holders 8a, 8b, 8c in an X axis direction; a Z axis movement mechanism for moving the holders 8a, 8b, 8c in a Z axis direction; and a θ rotation mechanism for rotating the holders 8a, 8b, 8c about Z axis. The second transport arm mechanism 8 takes out wafers W before cleaning from a cassette C one by one with a holder 8a in a lower place and places the wafers W on a transport-in/buffer mechanism not shown, while the second transport arm mechanism 8 takes out wafers W after cleaning from a transport-out/buffer mechanism 12 with a holder 8b in an upper place and transports the wafers W into a cassette C one by one.

A process section 6 is provided next to the second transport section 10. The process section 6 comprises: cleaning units 13, 14, 16, 17 for cleaning wafers W; and a drying unit for drying wafers W (not shown). The cleaning units 13, 16 are used for cleaning of the same kind and arranged in two levels, one on the other. The cleaning units 14, 17 are used for cleaning of the same kind and arranged in two levels, one on-the other. A treatment liquid supply section 19 is provided on the back side of the cleaning units 13, 14, 16, 17. The treatment liquid supply section 19 comprises: a plurality of treatment liquid supply sources 101, 102 and one kind of a treatment liquid selected from the plurality of treatment liquid supply sources 101, 102 is supplied to nozzles 41, 51 as shown in FIGS. 2, 3, 4 and 6.

Wafers W are taken out from the cassette C by the first transport arm mechanism 3 and then placed in the transport-in/buffer mechanism 11. The wafers W are further transferred to the second transport arm mechanism 8 from the transport-in/buffer mechanism 11 and transported into the treatment units 13 to 17 of the process section 6. In the cleaning unit 13, wafers W are first cleaned by a treatment liquid mainly composed of a first chemical liquid, then rinsed by pure water and then spin-dried by a spin rotation. Then, in the cleaning unit 14, the wafers are-cleaned by a treatment liquid mainly composed of a second chemical liquid which is different from the first chemical liquid, then rinsed by pure water and then spin-dried by a spin rotation. In the cleaning unit 15, the wafers W are subjected to a final cleaning with pure water and then spin-dried by spin rotation.

Then, a cleaning unit 13 will be described with reference to FIGS. 2 to 6.

Figure 2:
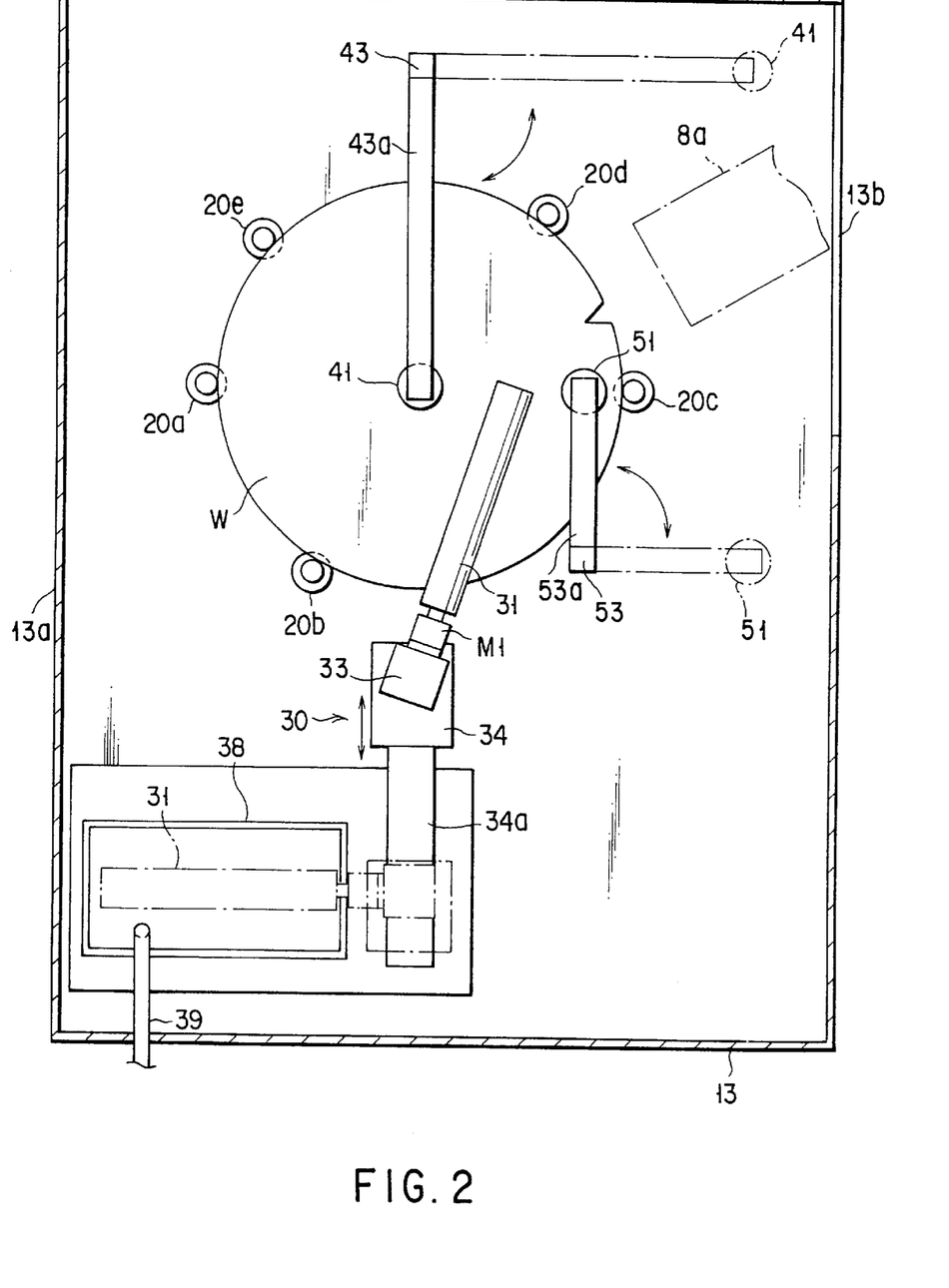
FIG. 2 is a schematic plan view showing a scrubbing apparatus according to an embodiment of the present invention.

A transport in-/outlet 13b is provided in a side wall of a chamber 13a. A shutter (not shown) is mounted to the transport-in/outlet 13b and silicon wafers W are taken in or out of the chamber 13a through the transport in-/outlet 13b with the shutter opened by the second transport arm mechanism 8. The wafers W has a diameter of 8 inches or 12 inches and a V notch is formed at a point on the periphery of each wafer.

Figure 3:
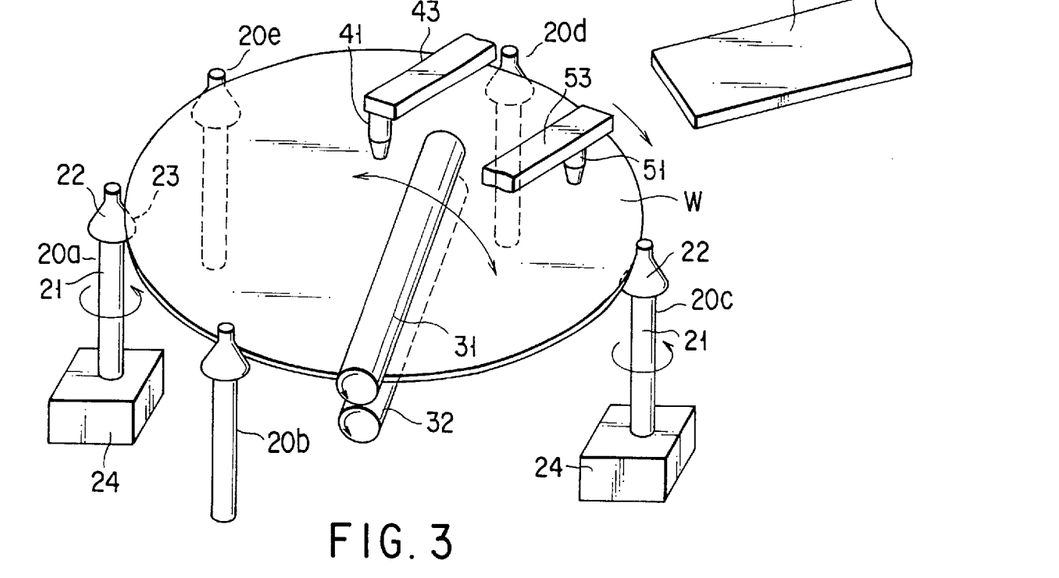
FIG. 3 is a perspective view showing a main portion of the scrubbing apparatus according to the embodiment of the present invention.

In the chamber 13a, a drain cup 90 (not shown: see FIG. 12) is disposed in a communication with an exhaust passage and a drainage liquid passage. Rotary guide members 20a to 20e as a substrate support section are vertically arranged at proper intervals in the drain cup 90 and a wafer W is rotatably supported by the rotary guide members 20a to 20e. Each of the five rotary guide members 20a to 20e comprises: a vertical shaft 21; and a rotary guide 22 mounted at the tip of the vertical shaft 21. The rotary guide 22 has the shape of a frustum of right circular cone with an upper diameter being smaller than a lower diameter and when the rotary guides 22 support the wafer W the slope of each rotary guide 22 is put in contact with the circumferential portion of a wafer W. The slop 23 of the rotary guide 22 is made from a soft resin material so as not to hurt a wafer W. It is preferred that the slop 23 is made from a resin material which is hard to produce particles from itself.

A motor 24 is only required to be provided to at least one of the rotary guide members 20a to 20e. In this embodiment, two motors 24 are respectively attached to two rotary guide members 20a, 20c. The two motors 24 are controlled in a synchronized manner by a controller 100. With such a synchronous rotation drive adopted, the wafer W is rotated smoothly. In the mean time, the other rotary guide members 20b, 20d, 20e are respectively supported by bearings 25 in a freely rotatable manner.

Figure 4:
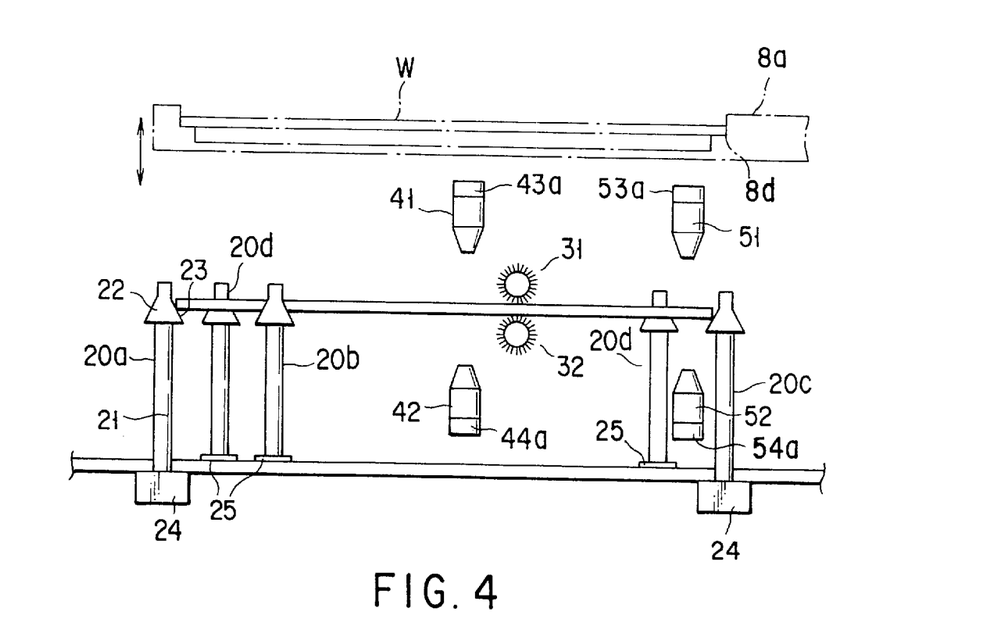
FIG. 4 is a view showing the main portion of the scrubbing apparatus when viewed from a side.

The wafer W is transferred onto these rotary guide members 20a to 20e from the second transport arm mechanism 8. A step 8d is formed in the holder 8a of the second transport arm mechanism, as shown in FIG. 4 and the periphery of the wafer W is not only supported by the step 8d, but the center of the wafer:W is automatically adjusted in position.

A first roll brush 31 is disposed above an upper surface (front side surface) of the wafer W, while a second roll brush 32 is disposed under a lower surface (back side surface) of the wafer W. The first and second roll brushes 31, 32 are made from soft sponge and has a length a little longer than radius of the wafer.

Figure 5:
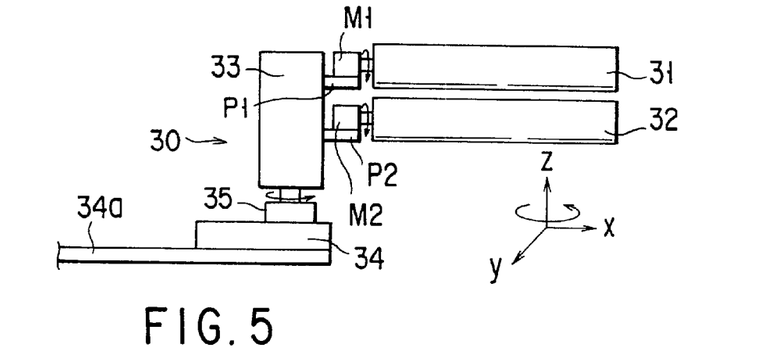
FIG. 5 is a view showing a brush drive mechanism when viewed from a side.

As shown in FIGS. 2 and 5, the first and second roll brushes 31, 32 are connected with rotary shafts of motors M1, M2 of a drive mechanism 30 and rotate about horizontal axes thereof. The first motor M1 is held by a support pole 33 with a support plate P1 interposed therebetween and the second motor M2 is held by a support pole 33 with a support plate P2 interposed therebetween.

The support pole 33 has two Z axis movement mechanisms (not shown) in its interior and the first support plate P1 is raised or lowered by one Z axis movement mechanism and the second support plate P2 is raised or lowered by the other Z axis movement mechanism. Besides, a pressure adjustment mechanism (not shown) is also provided in the interior of the support pole 33. The pressure adjustment mechanism works for fine control of a pressure on the wafer W of the brushes 31, 32 whose distance is adjusted by the Z axis movement mechanism. Such a pressure adjustment mechanism is described in, for example U.S. Pat. No. 5,685,039.

A θ rotation drive section 35 is connected to the lower end of the support pole 33 and the support pole 33 is subjected to θ rotation about Z axis. When the support pole 33 is subjected to θ rotation, the roll brushes 31, 32 are oscillated about the support pole 33 together with the θ rotation. Besides, the θ rotation drive section 35 is mounted on a X axis drive section 34 and the brushes 31, 32 are slidably moved on a guide rail 34a along an X axis direction together with the support pole 33. With such a drive mechanism 30 adopted, the brushes 31, 32 reciprocate between working positions and home positions.

As shown in FIG. 2, a brush cleaning vessel 38 is provided at the home positions of the brushes. 31, 32 and dirt (attached foreign matter) of the brushes 31, 32 is removed therein. A supply pipe 39 is provided in the brush cleaning vessel 38 and pure water is supplied into the brush cleaning vessel 38 from a pure water supply source (not shown) as a cleaning liquid. A drainage port (not shown) is provided at the bottom of the brush cleaning vessel 38. The drainage port is communicated with a recovery/reproduction system (not shown) for recovery and reproduction of drainage. The brushes 31, 32 are inserted into the brush cleaning vessel 38 and pure water is supplied therein through the supply pipe 39 while the brushes 31, 32 are rotated, so that the brushes 31, 32 are cleaned. In the mean time, since the brushes 31, 32 are provided with a cleaning liquid supply passage in the interior thereof, the brushes 31, 32 may be cleaned while the cleaning liquid is discharged from the interior of itself.

As shown in FIG. 4, the scrubbing apparatus of this embodiment is equipped with four nozzles 41, 42, 51, 52. A first main nozzle 41 and a first auxiliary nozzle 51 are disposed above the wafer W in such a manner that both nozzles 41, 51 may not interfere with each other. A second main nozzle 42 and a second auxiliary nozzle 52 are disposed under the wafer W in such a manner that both nozzles 42, 52 may not interfere with each other.

The first main nozzle 41 is attached to one end of an arm 43a and the other end of the arm 43a is connected to and supported by a vertical shaft of a drive mechanism 43. When the arm 43a is oscillated by the drive mechanism 43, the first main nozzle 41, as shown in FIG. 2, moves to a working position (right above the central region of the wafer W) from a home position. The first main nozzle 41 is to clean a pattern region of the wafer W. On the other hand, the second main nozzle 42 is attached to one end of an arm 44a and the other end of the arm 44a is connected to and supported by a vertical shaft of a drive mechanism 44. The second main nozzle 42 virtually acts in the same way as the first main nozzle 41.

The first auxiliary nozzle 51 is attached to one end of an arm 53a and the other end of the arm 53a is connected to and supported by a vertical shaft of a drive mechanism 53. When the arm 53a is oscillated by the drive mechanism 53, the first auxiliary nozzle 51, as shown in FIG. 2, moves to a working position (right above a position on the peripheral region of the wafer W) from a home position. The first auxiliary nozzle 52 is to clean a non-pattern region of the wafer W. On the other hand, the second main nozzle 52 is attached to one end of an arm 54a and the other end of the arm 54a is connected to and supported by a vertical shaft of a drive mechanism 54. The second auxiliary nozzle 52 virtually acts in the same way as the first auxiliary nozzle 51.

Figure 6:
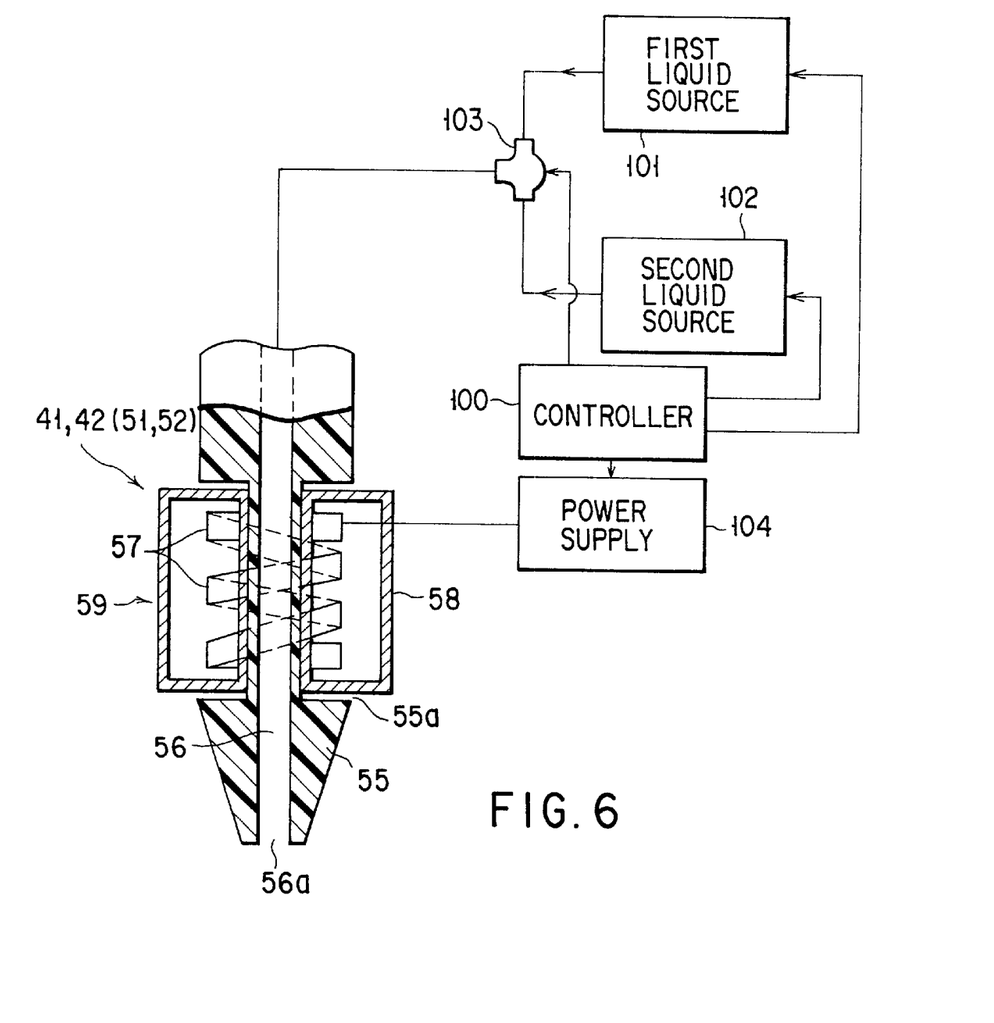
FIG. 6 is a sectional view of an ultrasonic cleaning nozzle (a megasonic nozzle) and a block diagram showing a cleaning liquid supply circuit.

Then, the first main nozzle 41 as a representative of the cleaning nozzles, will be described with reference to FIGS. 6 and 7.

The nozzle 41 is a so-called megasonic nozzle equipped with an ultrasonic oscillator 59. A flow passage 56 of the nozzle 41 is communicated with first and second liquid sources 101, 102 through a change-over valve 103. The first liquid source 101 stores pure water as a first cleaning liquid and the second liquid source 102 stores a chemical solution as a second cleaning liquid. The second cleaning liquid is, for example, an APM liquid, a DHF liquid, an HPM liquid or the like, which are used in RCA cleaning. The liquid supply sources 101, 102 are respectively provided with flow rate control valves which are controlled by a controller 100. A change-over valve 103 is inserted in a cleaning liquid supply circuit and its action is controlled by the controller 100. Supply circuits from the first and second liquid sources 101, 102 are changed over by the change-over valve 103 and the first or second liquid is supplied into the nozzle flow passage 56. As the cleaning liquids, for example, pure water is used after film formation, while a chemical liquid is used after CPM polishing.

The nozzle body 55 is made from a resin with resistance to chemicals and the ultrasonic oscillator 59 is mounted in the vicinity of the tip. The ultrasonic oscillator 59 comprises: a transducer 57 which is inserted in an annular recess 55a of the nozzle body 55; a protective cover 58 surrounding the transducer 57; and a power source 104 for supplying a power to the transducer 57. The transducer. 57 has a helical form and surrounds the flow passage 56 in the vicinity of the tip of a liquid discharge port 56a. The protective cover 58 is made from stainless steel.

When the controller 100 sends an instruction signal to the power source 104, electricity is supplied to the transducer 57 from the power source 104 and ultrasonic waves with a frequency in the range of from 1 to 2 MHz are emitted from the transducer 57. The ultrasonic waves are applied on a cleaning liquid in the flow passage 56 through the nozzle body 55. The cleaning liquid applied with ultrasonic waves is discharged toward the wafer W from the liquid discharge port 56a and acts on foreign matter attached on the wafer W. An attaching force of the foreign matter is weaken by the cleaning liquid, which accelerates separation of the foreign matter from the wafer W.

Then, The case where both surfaces of the wafer W are cleaned using the scrubbing apparatus with reference to FIGS. 2 to 7.

A shutter is opened while the roll brushes 31, 32; the main nozzles 41, 42; and the auxiliary brushes 51, 52 are kept stand-by in respective home positions, a wafer W is transported into the chamber 13a by the second transport arm mechanism 8 and the wafer W is transferred to the rotary guide members 20a to 20e, wherein the wafer is already positioned in regard to a notch prior to transportation into the chamber 13a.

Then, the wafer W is rotated by the rotary guide members 20a to 20e and not only are the roll brushes 31, 32 respectively moved to the working positions from the home positions, but the nozzles 41, 42, 51, 52 are respectively moved to the working positions from the home positions. At first, a distance between the brushes 31, 32 is adjusted so as to be larger than the thickness of the wafer W and after the brushes 31, 32 arrive at the working positions, the pressure adjustment mechanism presses the roll brushes 31, 32 to the front side and back side surfaces of the wafer W respectively under a specific pressure. Generally speaking, a pressure of the first brush 31 on the wafer front side surface (the pattern forming surface) is lower than that of the second brush 32 on the wafer back side surface (the non-pattern forming surface). The reason why is not to give any damages on a circuit pattern.

Then, not only is the cleaning liquid supplied on the front side and back side surfaces of the wafer W in the vicinity of the rotation center thereof from the main nozzles 41, 42, but the cleaning liquid is supplied on the front side and back side surface along the peripheral region thereof from the auxiliary nozzles 51, 52. The roll brushes 31, 32 are moved so as to traverse from one peripheral region of the wafer W to the other peripheral region while being rotated. With such a traverse movement, the cleaning liquid is diffused from the rotation center of the wafer W toward the peripheral region. At this point, the cleaning liquids discharged from the nozzles 41, 42, 51, 52 are applied with ultrasonic waves.

Figure 7:
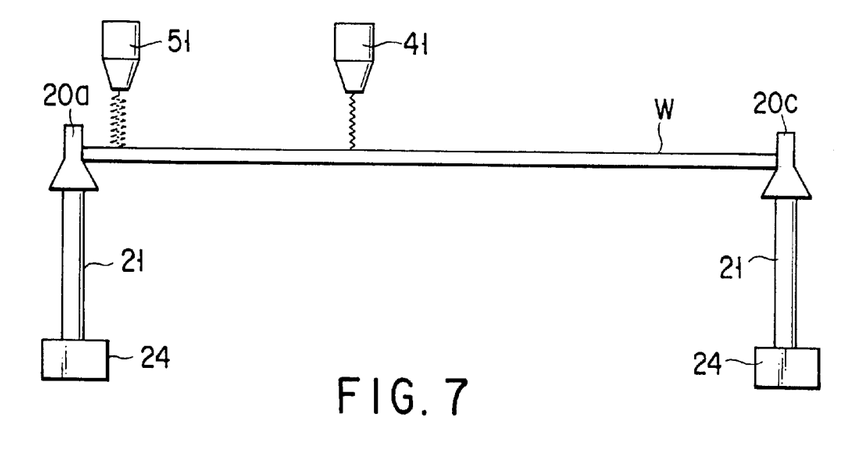
FIG. 7 is a schematic view for illustrating actions in wafer cleaning.

As shown in FIG. 7, electricity supplied from the power source 104 is controlled by the controller 100 and while the cleaning liquid supplied from the main nozzle 41 is applied with weaker ultrasonic waves, the cleaning liquid from the auxiliary nozzle 51 is applied with stronger ultrasonic waves. For example,.when the central region of the wafer W is cleaned, ultrasonic oscillation with a power as weak as a pattern does not receive any damages by, for example ultrasonic oscillation with a power of 100W, is given to the cleaning liquid, wherein the power source 104 is not switched off, whereas, when the peripheral region of the wafer W is cleaned, ultrasonic oscillation with a strong power, for example ultrasonic oscillation with a power of 150W is given to the cleaning liquid. In this case, a higher cleaning power is given to the peripheral region in the wafer W than to the central region, whereby attached foreign object such as particles is sure to be swiftly removed from the peripheral region of the wafer W. Besides, the cleaning liquid which is applied with a strong ultrasonic power by the auxiliary nozzle 51 is supplied toward the center along a radius by 20 to 50 mm in width from the circumferential portion.

Not only is the cleaning liquid applied with ultrasonic waves supplied by the nozzles 41, 42, 51, 52 while the nozzles are moved, but the brushes 31, 32 are reciprocated while the wafer W is rotated. Thereby, the wafer W is cleaned thoroughly in every point all over the wafer W from the central region to the peripheral region. Especially, since the cleaning liquid supplied from the auxiliary nozzle 42 is applied with high power ultrasonic waves with a frequency of 1.8 MHz, there is no chance when the peripheral region of the wafer W is short of cleaning. Such cleaning liquid applied with ultrasonic waves can easily penetrate into a tiny gap and therefore, the wafer W is thoroughly cleaned at every point thereon. Hence, the cleaning liquid penetrates even at a site where the roll brushes 31, 32 cannot contact, for example between the rotary guide members 20a to 20e and the wafer W, and sufficiently cleans every site on the wafer W by a cleaning accelerating action of ultrasonic waves. Since the rotary guide members 20a to 20w and the wafer W are rotated while changing relative position to each other, contact positions between both are constantly interchanged and thereby every portion on the wafer W is cleaned.

After the cleaning, the nozzles 41, 42, 51, 52 and the roll brushes 31, 32 are returned to the respective home positions.

Then, the wafer W is rotated at a high speed by the rotary guide members 20a to 20e and the cleaning liquid on the wafer W is removed by separation therefrom to dry the surfaces of the wafer W.

According to the apparatus of the embodiment described above, a fine pattern in the central region of a wafer W does not receive any damages, while the periphery of the wafer W can sufficiently be cleaned with certainty.

Besides, according to the apparatus of the embodiment, since the wafer W is supported by the rotary guide members 20a to 20e only at the peripheral region, a large space can be available on the back side surface of the wafer W and the brush 32, the main nozzle 42 and the auxiliary nozzle 52 can also be provided on the back side surface of the wafer W. The back side surface of the wafer W can be cleaned by the brush 32, and the main and auxiliary nozzles 42, 52 to the same cleanliness level as the front side surface. For this reason, since both surfaces of a wafer W can be cleaned without use of a conventional reversing device, which enables not only downsizing of the apparatus but shortening of cleaning time by a great margin and improvement in throughput.

While, in the embodiment, the case is described, where the middle portion of a wafer W is subjected to weak cleaning using the main nozzle 41 and the peripheral portion of the wafer W is subjected to strong cleaning using the auxiliary nozzle 51, only one nozzle may be used for cleaning by the ultrasonic wave not only the middle portion of the wafer W but the peripheral portion as well. In this case, the cleaning liquid applied with a weak power ultrasonic waves is supplied in the central region of the wafer W through the nozzle, while the cleaning liquid with a strong power ultrasonic waves is supplied along the peripheral region through the same nozzle.

The second embodiment of the present invention will be described with reference to FIGS. 8 to 11.

Figure 9:
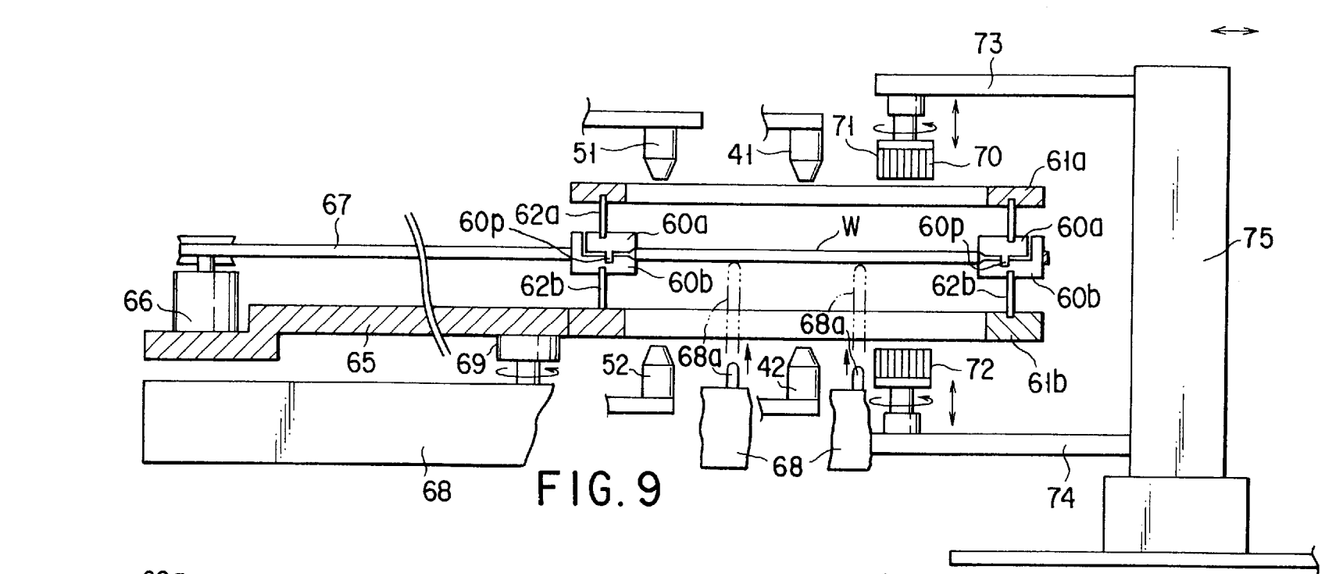
FIG. 9 is a view showing the scrubbing apparatus according to the second embodiment of the present invention when viewed from a side.
Figure 10:
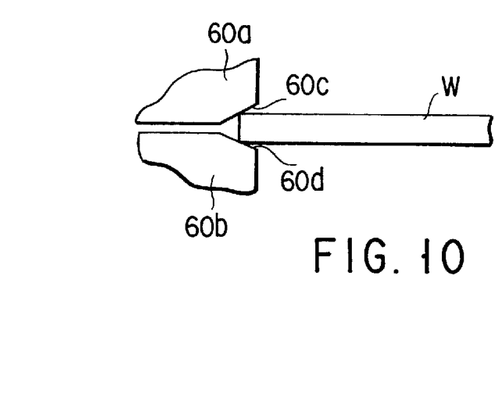
FIG. 10 is an enlarged view showing a wafer supporting part of a pressed-between type.

In the embodiment, as shown in FIGS. 9 and 10, a wafer W is held by a pair of support rings 60a, 60b, one on the other, as a substrate support section, in such a manner that the circumferential portion of the wafer W is pressed between support rings 60a, 60b. The support ring 60a in the upper place is connected to the support ring 61a in the upper place in a freely rotatable manner through a plurality of ribs 62a and a plurality of bearings 63b (see FIG. 11). A support ring 60b in the lower place is connected to a support ring 61b in the lower in a freely rotatable manner place through a plurality of ribs 62b and the plurality of bearings 63b (see FIG. 11).

Figure 8:
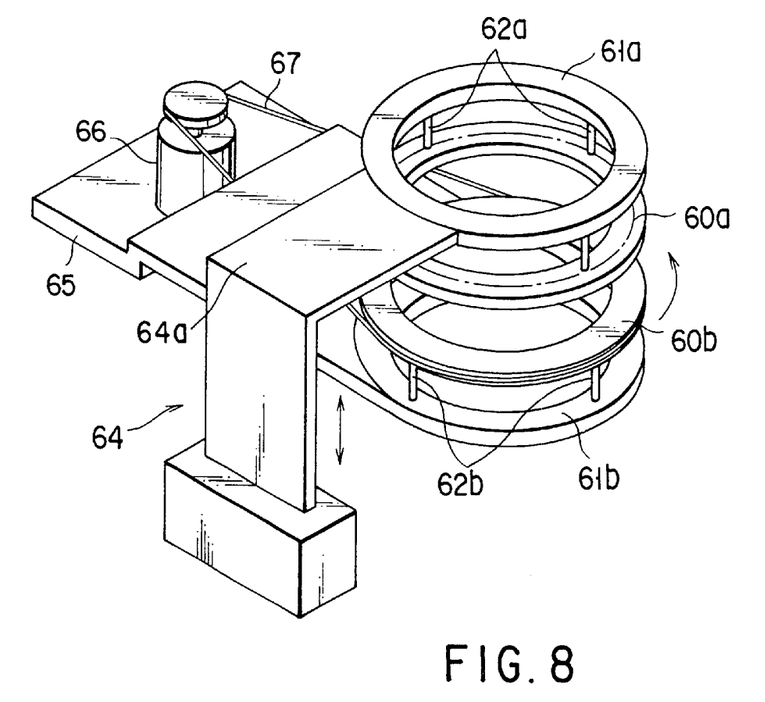
FIG. 8 is a perspective view schematically showing a scrubbing apparatus according to a second embodiment of the present invention.

As shown in FIG. 8, the support ring 61a in the upper place is connected to and held by an arm 64a of a vertically shiftable mechanism 64. When the support ring 60a in the upper place is lowered together with the support ring 61a, a protrusion 60p downward protruding from the support ring 60a is fit into a recess of the support ring 60b in the lower place and not only are the support rings 60a, 60b in the upper and lower places connected with each other, but the wafer W is pressed between both support rings 60a, 60b. Inside diameters of the support rings 60a, 60b in the upper and lower places are a little smaller than that of the wafer W.

A belt 67 is wound over the periphery of the support ring 60b in the lower place and a rotation drive force of a motor 66 is transmitted to the support ring 60b through the belt 67. Here, the motor 66 and the support ring 61b in the lower place are fast held to the base 65.

As shown in FIG. 101 the periphery of the wafer W is put in contact with an inward inclined slope 60c of the support ring 60a in the upper place and an inward inclined slope 60c of the support ring 60b in the lower place and in this condition, the wafer W is horizontally held by both support rings 60a, 60b.

Figure 11:
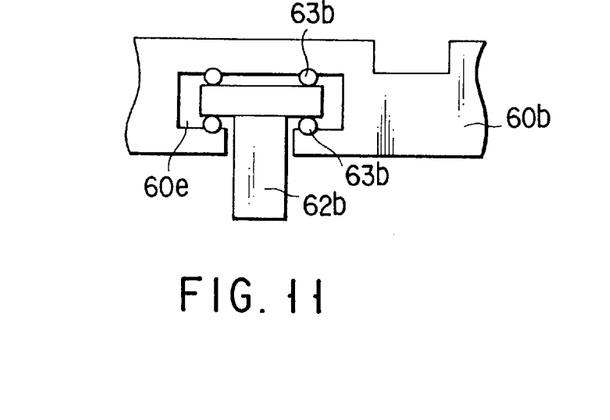
FIG. 11 is a enlarged view showing a rotary supporting section for supporting a wafer rotatably.

As shown in FIG. 11, the fore end of a connecting rib 62b (62a) is in the sectional shape of a letter T and the fore end is mounted to the support ring 60b in the lower place with a bearing 63b interposed therebetween. With this structure, the support ring 60b in the lower place can move relatively to the connecting rib 62b and the support ring 61b. In a similar manner, the support ring 60a in the upper place can move relatively to the connecting rib 62a and the support ring 61a.

As shown in FIG. 9, a table 68 is provided under the base 65. The table 68 can move between a stand-by position under the base 65 and a reception/transfer position under the wafer W by rotation mechanism 69 mounted on the lower surface of the base 65.

A first disk brush 71 is mounted to the fore end of an arm 73 of a drive mechanism 75 and opposed to the front side surface (upper surface) of the wafer W. A second disc brush 72 is mounted to the fore end of an arm 74 of the drive mechanism 75 and opposed to the back side surface (lower surface) of the wafer W. Brush rotation mechanisms (not shown) are respectively provided inside the arms 73, 74 and the brushes 71, 72 are rotated about respective vertical axes by drive of both mechanisms. Besides, the arms 73, 74 are supported in a movable manner along horizontal directions by the drive mechanism 75.

In the embodiment, working positions of the first main nozzle 41 and the first auxiliary nozzle: 51 are above the support ring 61a in the upper place and working positions of the second main nozzle 42 and the second auxiliary nozzle 52 are under the support ring 61b in the lower place.

Then, actions of a scrubbing apparatus of the embodiment will be described.

The support ring 60a in the upper place is raised and a wafer W is inserted in between the support rings 60a, 60b, while the brushes 71, 72 and nozzles 41, 42, 51, 52 are kept in a stand-by position at respective home positions. Then, the table 68 is moved to the reception/transfer position, a plurality of pins 68b are protruded from the upper surface of the table 68 and the wafer W is transferred on the pins 68a. Then, the pins 68a are retreated into the table 6B and the wafer W is further moved on the support ring 60b in the lower place. The support ring 60a in the upper place is lowered to a working position, the support rings 60a, 60b are coupled with each other and the wafer is thus held. Thereafter, the table 68 is lowered to its home position.

Then, the support ring 60b in the lower place is given a rotation force and the wafer W is rotated together with the support rings 60a, 60b. On the other hand, not only are the brushes 71, 72 moved toward above the wafer W but the nozzles 41, 42, 51, 52 are respectively moved to working positions from home positions. Then, not only is the cleaning liquid is supplied from the main nozzles 41, 42 to the rotation center of the wafer W but the cleaning liquid is supplied to the peripheral region of the wafer W from the auxiliary nozzles 51, 52. The brushes 71, 72 are respectively put into contact with the front side and back side surfaces of the wafer W under specific pressures while the cleaning liquid applied with ultrasonic oscillation is supplied and the brushes 71, 72 are reciprocated from one peripheral region of the wafer W to the other peripheral region while being rotated.

Figure 12:
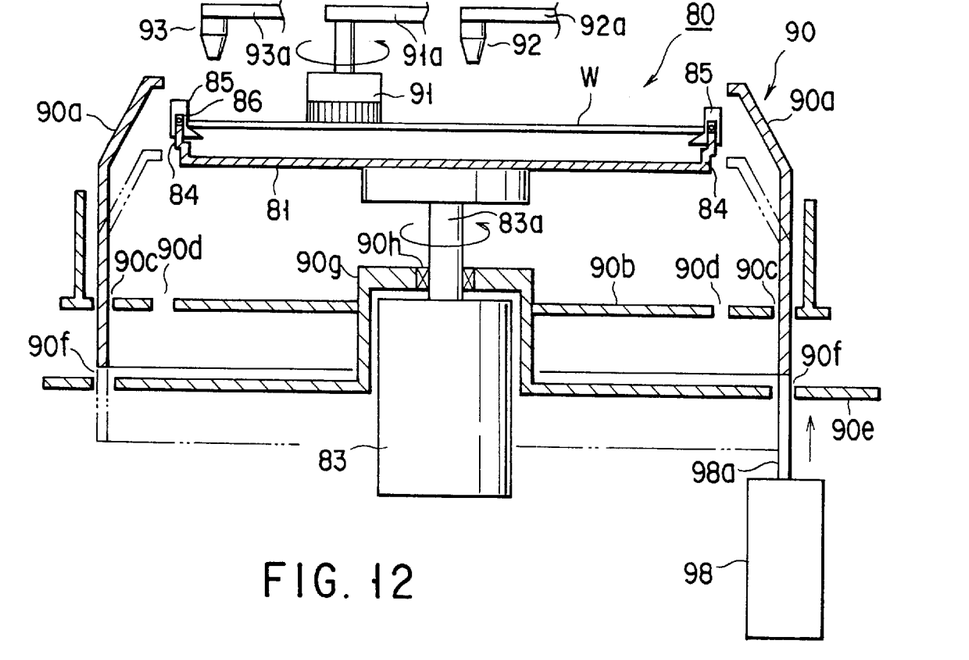
FIG. 12 is a view showing a scrubbing apparatus according to a third embodiment of the present invention.

Then, the third embodiment of the present invention will be described with reference to FIGS. 12 and 13.

In the embodiment, a mechanical chuck 80 is used as a substrate support section. The mechanical chuck 80 is provided inside a drain cup 90. The drain cup 90 is provided with a movable cup portion 90a and a fixed cup portion 90b. The movable cup 90a is connected to a rod 98a of a cylinder 98 through openings 90c, 90f of the fixed cup portion 90b. When the rod 98a gets protruded from the cylinder 98, the movable cup 90a is raised and to the contrary, when the rod 98a gets retreated into the cylinder 98, the movable cup 90a is lowered.

A rotary drive shaft 83a of a motor 83 penetrates a central projection 90g of the fixed cup portion 90b and connected to the bottom plate 81 of the mechanical chuck 80. A seal bearing 90h is provided between the rotary drive shaft 83a and the central projection 90g. A plurality of drain holes 90d are formed in the fixed cup portion 90b at proper positions thereof and cleaning drainage is discharged through the drain holes 90d outside the cup 80.

The bottom plate 81 of the mechanical chuck 80 has almost the same size as the diameter of the wafer W. Six erect portions 84 are provided along the periphery of the bottom plate 81 and wafer support sections 85 are respectively provided on the erect portions 84. An inner surface of a wafer support section 85 is inward inclined in the lower portion starting at a position half a depth and the periphery of the wafer W is put in contact with the upper side of the inward inclined slope. Each of the wafer support sections 85 is mounted on an erect portion 84 with a horizontal shaft 86 interposed therebetween. Besides a weight not shown is included in a wafer support section 85.

Figure 13:
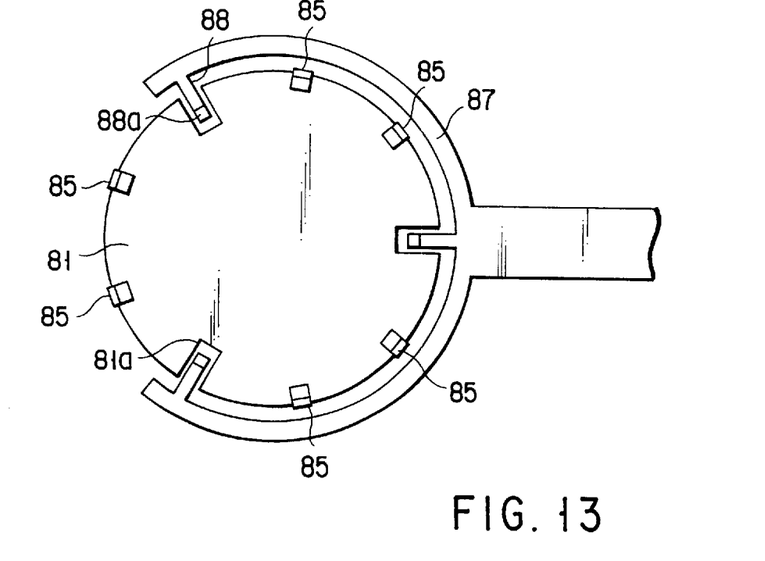
FIG. 13 is a plan view showing an arm holder and a spin chuck when a wafer is transferred.

The wafer W is transferred to the mechanical chuck 80 by a transport arm 87 shown in FIG. 13. The transport arm 87 has a ring-like form without an arc portion whose inner diameter is larger than that of the bottom plate 81 and has wafer placing strips 88 extending inward from three positions on inner side of the ring form. The wafer W is placed on projections 88a formed at the fore end of the wafer placing strip 88.

Cut-aways 81a through which the wafer placing strips 88 can pass are formed at positions of the bottom plate 81 corresponding to the wafer placing strips 88. The wafer W held on the transport arm 87 is moved to a specific position above the mechanical chuck 80, thereafter the transport arm 87 is lowered while allowing the wafer placing strips 88 to pass through the cur-aways 81a and thereby the wafer W is transferred to the wafer support section 85 of the mechanical chuck 80.

The disk brush 91 is movably supported by a movement mechanism (not shown) through an arm 91a. A main nozzle 92 is movably supported by a movement mechanism (not shown) through an arm 92a. Besides, an auxiliary nozzle 93 is movably supported by a movement mechanism (not shown) through an arm 93a. The brush 91 and the nozzles 92, 93 are moved to working positions from home positions by the movement mechanisms and the wafer W which is held by the mechanical chuck 80 is opposed to the brush 91 and the nozzles 92, 93. In this case, the main nozzle 92 is disposed right above the central region of the wafer W and the auxiliary nozzle 93 is disposed right above the peripheral region of the wafer W. The main and auxiliary nozzles 92, 93 are equipped with ultrasonic wave oscillator 59 as in the above described cases.

In the scrubbing apparatus with such a construction, not only the cleaning liquid is supplied in the central region of a wafer W from the main nozzle 92 while the wafer W is rotated by the mechanical chuck 80, but the cleaning liquid applied with ultrasonic waves is supplied along the peripheral region of the wafer W from the auxiliary nozzle 93. Scrubbing is progressed while the brush 91 is rotated and moved across the wafer W.

When a centrifugal force acts on the wafer support sections 85, the upper portion is inward inclined under influence of the weight and the brush 91 is prevented from advancing up to a position very close to the wafer periphery in the spots where the wafer support sections 85 are provided. However, the cleaning liquid applied with ultrasonic waves from the auxiliary nozzle 93 penetrates through gaps between the wafer support sections 85 and the wafer periphery and as a result, the cleaning liquid can reach every point all over the peripheral region and the circumferential portion of the wafer W. Hence, the peripheral region and the circumferential portion of the wafer W are cleaned and thereby, not only the central region but the peripheral region of the wafer W can be cleaned.

A method may also be employed in which a position of the wafer where the cleaning liquid is dropped is irradiated with ultrasonic waves and thereby the cleaning liquid is vibrated. There is no limitation to a method in which the main nozzles 41, 42 supplies the cleaning liquid to almost the rotation center of the wafer W, but the main nozzles 41, 42 can be moved between the peripheral region and the rotation center.

The auxiliary nozzles 51, 52 may supply the cleaning liquid to any region on the wafer, as long as the auxiliary nozzles 51, 52 directs the cleaning liquid to a region outside the pattern forming region. Besides, a method may also employed in which the main nozzles 41, 42 are constructed from a megasonic nozzle as in the case of the auxiliary nozzles 51, 52 and ultrasonic waves with a power as weak as a pattern does not receive any damages by is given to the cleaning liquid and the central region of the wafer W is cleaned with the cleaning liquid through the main nozzles 41, 42.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A scrubbing apparatus for cleaning a surface of a substrate or a surface of a film on a substrate, comprising:
   a substance support section for supporting a substrate horizontally and substantially in contact with a circumferential portion of the substrate while front side and back side surfaces of the substrate are substantially kept untouched in operation by the substance;
   a rotation drive device for driving the substrate support section to rotate in order to give a rotation force to the substrate;
   a brush member for scrub-cleaning the substrate while contacting at least said front side surface;
   a liquid source for supplying a cleaning liquid;
   a first supply circuit communicated with the liquid source;
   a main nozzle, having a discharge port for discharging the cleaning liquid through the first supply circuit, and an annular recess provided near the discharge port to surround a part of the first supply circuit, for supplying the cleaning liquid in at least a central region of the substrate;
   a second supply circuit communicated with the liquid source;
   an auxiliary nozzle, having a discharge port for discharging the cleaning liquid through the second supply circuit, and an annular recess provided near the discharge port to surround a part of the second supply circuit, for supplying the cleaning liquid in at least a peripheral region of the substrate;
   a first ultrasonic oscillator provided in the annular recess of the main nozzle, for applying ultrasonic waves to the cleaning liquid passing through the first supply circuit;
   a second ultrasonic oscillator provided in the annular recess of the auxiliary nozzle, for applying ultrasonic waves to the cleaning liquid passing through the second supply circuit;
   a power supply for supplying a power to the first and second ultrasonic oscillators;
   a control device for controlling the second ultrasonic oscillator so that the ultrasonic waves are applied to the cleaning liquid supplied from the auxiliary nozzle to the peripheral region of the substrate, and controlling the power outputted from the power supply to the first and second ultrasonic oscillators so that a cleaning power for the peripheral region of the substrate by the auxiliary nozzle is higher than that for the central portion of the substrate by the main nozzle,
   wherein the control device includes a mechanism configured to control the main nozzle and the auxiliary nozzle so as to operate simultaneously.

2. A scrubbing apparatus according to claim 1, wherein the substrate support section has a plurality of rotary guides each having a base portion which has the shape of a frustum of a right circular cone put in contact with the circumferential portion of the substrate, and
   the rotation drive device drives at least one of the plurality of rotary guides to rotate.

3. A scrubbing apparatus according to claim 1, wherein the substrate support section has one pair of support rings for supporting the substrate in such a manner that the circumferential portion of the substrate is pressed from the upper and lower sides, and the rotation drive device drives at least one of the support rings to rotate.

4. A scrubbing apparatus according to claim 1, wherein the ultrasonic oscillator includes a transducer having a helical form.

5. A scrubbing apparatus for cleaning a surface of a substrate or a surface of a film on a substrate, comprising:
   a pair of support rings for supporting a substrate horizontally and substantially in such a manner that a circumferential portion of the substrate is held by being clamped from above and below while front side and back side surfaces of the substrate are substantially kept untouched in operation by the substance;

a rotation drive device for driving the substrate support section to rotate in order to give a rotation to the substrate;

a brush member for scrub-cleaning the substrate while contacting at least said front side surface;

a liquid source for supplying a cleaning liquid;

a supply circuit communicated with the liquid source;

a nozzle, having a discharge port for discharging the cleaning liquid through the supply circuit, and an annular recess provided near the discharge port to surround a part of the supply circuit;

a nozzle movement mechanism for moving the nozzle;

an ultrasonic oscillator having a spiral transducer provided in the annular recess of the nozzle, for applying ultrasonic waves to the cleaning liquid passing through the supplying circuit;

a protective cover surrounding the transducer and a part of the flow passage through which the cleaning liquid flows; and a control device for controlling the ultrasonic oscillator and the nozzle movement mechanism so that the ultrasonic waves are applied to the cleaning liquid supplied in at least the peripheral region of the substrate, wherein the control device controls the ultrasonic oscillator so that a cleaning power for the peripheral region of the substrate is higher than that for the central portion of the substrate by the main nozzle, and controls the nozzle movement mechanism to move the nozzle so that the cleaning liquid applied with the ultrasonic waves, is supplied from the nozzle to the peripheral region and central region of the substrate.

* * * * *